(12) United States Patent
Miao et al.

(10) Patent No.: US 11,571,711 B2
(45) Date of Patent: Feb. 7, 2023

(54) ANTI-STICTION BOTTOM CAVITY SURFACE FOR MICROMACHINED ULTRASONIC TRANSDUCER DEVICES

(71) Applicant: BFLY OPERATIONS, INC., Burlington, MA (US)

(72) Inventors: Lingyun Miao, Fremont, CA (US); Keith G. Fife, Palo Alto, CA (US); Jianwei Liu, Fremont, CA (US); Jonathan M. Rothberg, Guilford, CT (US)

(73) Assignee: BFLY OPERATIONS, INC., Burlington, MA (US)

(*) Notice: Subject to any disclaimer, the term of this patent is extended or adjusted under 35 U.S.C. 154(b) by 509 days.

(21) Appl. No.: 16/683,652

(22) Filed: Nov. 14, 2019

(65) Prior Publication Data

US 2020/0156110 A1 May 21, 2020

Related U.S. Application Data

(60) Provisional application No. 62/810,358, filed on Feb. 25, 2019, provisional application No. 62/768,048, filed on Nov. 15, 2018.

(51) Int. Cl.
*B06B 1/02* (2006.01)
*B81B 3/00* (2006.01)
*B81C 1/00* (2006.01)

(52) U.S. Cl.
CPC ............ *B06B 1/0292* (2013.01); *B81B 3/001* (2013.01); *B81C 1/00984* (2013.01);
(Continued)

(58) Field of Classification Search
CPC ................. B06B 1/0292; B81B 3/001; B81B 2203/0127; B81B 2203/0315;
(Continued)

(56) References Cited

U.S. PATENT DOCUMENTS 9,067,779 B1 6/2015 Rothberg et al.
9,499,392 B2 11/2016 Rothberg et al.
(Continued)

FOREIGN PATENT DOCUMENTS

| CN | 101977026 A | 2/2011 |
| CN | 105307975 A | 2/2016 |
| CN | 109092650 A | 12/2018 |

OTHER PUBLICATIONS

International Preliminary Report on Patentability for International Application No. PCT/US2019/061419, dated Sep. 2, 2021.
(Continued)

*Primary Examiner* — Yasser A Abdelaziez
(74) *Attorney, Agent, or Firm* — Osha Bergman Watanabe & Burton LLP

(57) ABSTRACT

A method of forming an ultrasonic transducer device includes forming an insulating layer having topographic features over a lower transducer electrode layer of a substrate; forming a conformal, anti-stiction layer over the insulating layer such that the conformal layer also has the topographic features; defining a cavity in a support layer formed over the anti-stiction layer; and bonding a membrane to the support layer.

26 Claims, 12 Drawing Sheets

(52) U.S. Cl.
CPC ............... *B81B 2203/0127* (2013.01); *B81B 2203/0315* (2013.01); *B81B 2203/0392* (2013.01); *B81C 2201/0109* (2013.01); *B81C 2201/0125* (2013.01); *B81C 2201/0176* (2013.01)

(58) Field of Classification Search
CPC .... B81B 2203/0392; B81B 2201/0271; B81C 1/00984; B81C 2201/0109; B81C 2201/0125; B81C 2201/0176; B81C 2203/0735; B81C 2203/0771
See application file for complete search history.

(56) References Cited

U.S. PATENT DOCUMENTS

| | | | |
|---|---|---|---|
| 9,533,873 B2 | 1/2017 | Rothberg et al. | |
| 10,525,506 B2 | 1/2020 | Alie et al. | |
| 2004/0136049 A1* | 7/2004 | Cho | G02B 26/0841 216/47 |
| 2007/0059858 A1 | 3/2007 | Caronti et al. | |
| 2011/0055447 A1 | 3/2011 | Costa | |
| 2012/0243095 A1 | 9/2012 | Sagberg et al. | |
| 2013/0135971 A1 | 5/2013 | Nakanishi | |
| 2014/0217478 A1 | 8/2014 | Rothberg et al. | |
| 2014/0219062 A1* | 8/2014 | Rothberg | G10K 11/18 367/135 |
| 2014/0265720 A1 | 9/2014 | El-Gamal et al. | |
| 2015/0368097 A1 | 12/2015 | Behrendt et al. | |
| 2016/0009544 A1 | 1/2016 | Rothberg et al. | |
| 2016/0290970 A1 | 10/2016 | Rothberg et al. | |
| 2016/0318753 A1 | 11/2016 | Chou | |
| 2016/0332863 A1* | 11/2016 | Cheng | H01L 24/00 |
| 2016/0379973 A1 | 12/2016 | Rothberg et al. | |
| 2017/0305738 A1* | 10/2017 | Chang | B81B 3/001 |
| 2018/0243792 A1 | 8/2018 | Rothberg et al. | |
| 2019/0055117 A1 | 2/2019 | Steiert | |
| 2019/0231312 A1 | 8/2019 | Fife et al. | |
| 2019/0275561 A1 | 9/2019 | Fife et al. | |
| 2019/0336099 A1 | 11/2019 | Fife et al. | |
| 2019/0336103 A1 | 11/2019 | Fife et al. | |
| 2019/0336104 A1 | 11/2019 | Fife et al. | |
| 2020/0013691 A1 | 1/2020 | Liu et al. | |
| 2020/0102214 A1 | 4/2020 | Liu et al. | |
| 2020/0269279 A1 | 8/2020 | Miao et al. | |

OTHER PUBLICATIONS

Invitation to Pay Additional Fees dated Jan. 13, 2020 in connection with International Application No. PCT/US2019/061419.
International Search Report and Written Opinion dated Jan. 29, 2020 in connection with International Application No. PCT/US2019/061403.
International Search Report and Written Opinion dated Mar. 10, 2020 in connection with International Application No. PCT/US2019/061419.
PCT/US2019/061419, dated Sep. 2, 2021, International Preliminary Report on Patentability.
International Preliminary Report on Patentability dated May 27, 2021 in connection with International Application No. PCT/US2019/061403.
PCT/US2019/061419, dated Mar. 10, 2019, International Search Report and Written Opinion.
U.S. Appl. No. 16/683,750, filed Nov. 14, 2019, Miao et al.
PCT/US2019/061403, dated Jan. 29, 2020, International Search Report and Written Opinion.
PCT/US2019/061419, dated Jan. 13, 2020 Invitation to Pay Additional Fees.
Extended European Search Report dated Jul. 11, 2022 in connection with European Application No. 19884050.6.

* cited by examiner

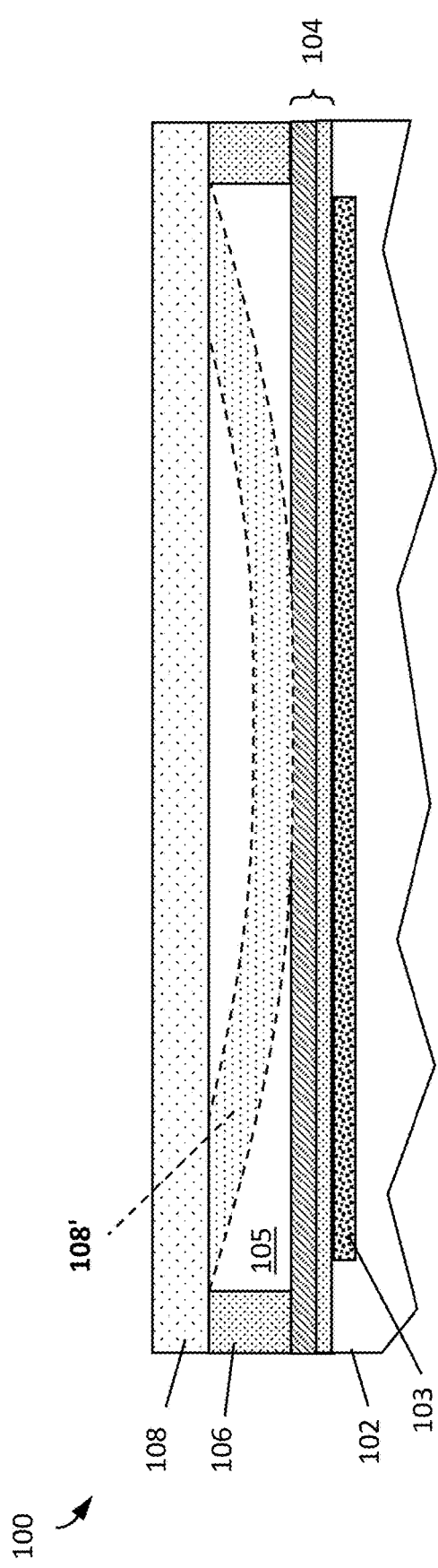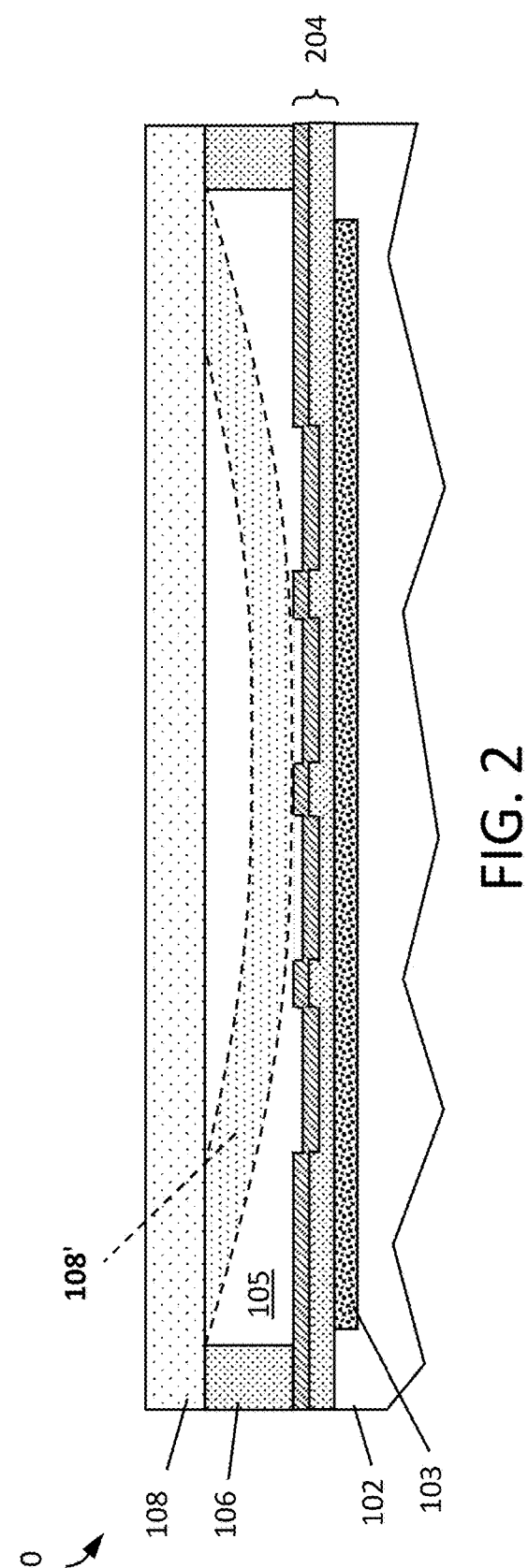

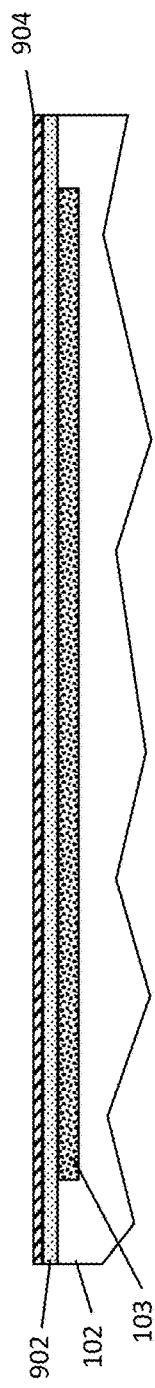 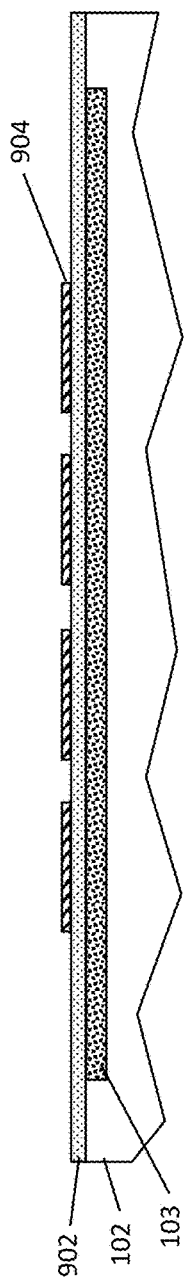 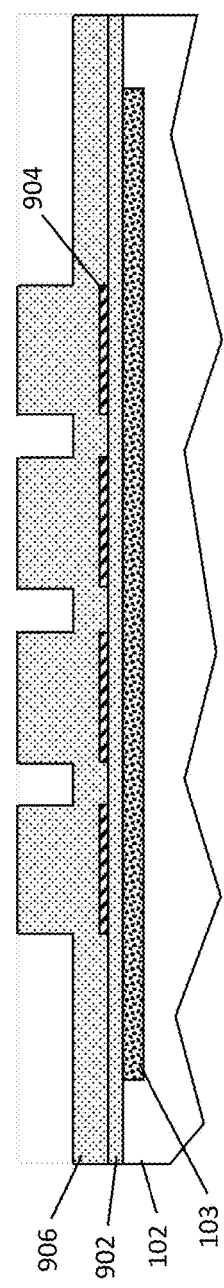 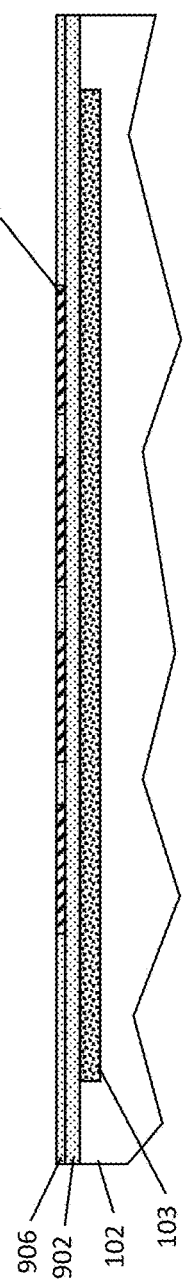
FIG. 9-1  FIG. 9-2  FIG. 9-3  FIG. 9-4

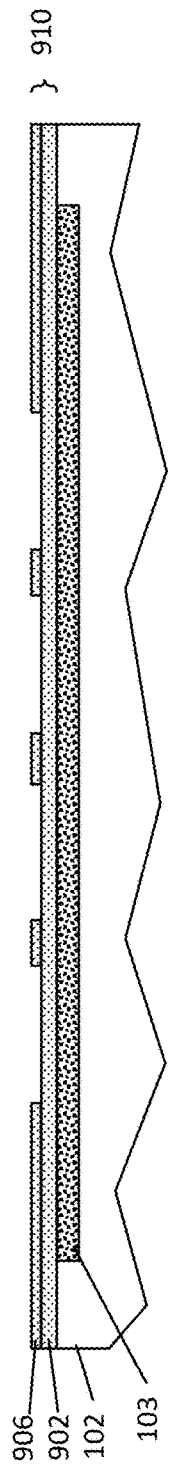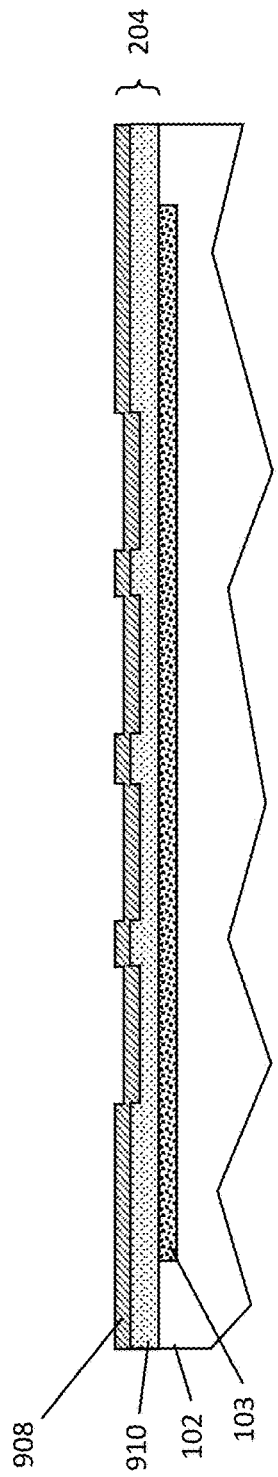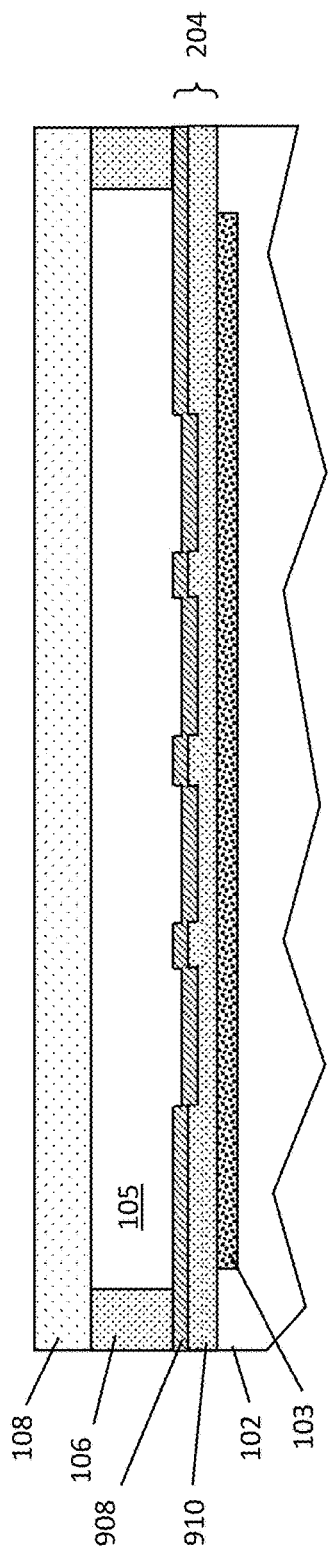

ANTI-STICTION BOTTOM CAVITY SURFACE FOR MICROMACHINED ULTRASONIC TRANSDUCER DEVICES

CROSS-REFERENCE TO RELATED APPLICATIONS

This application claims the benefit under 35 U.S.C. § 119(e) of U.S. Patent Application Ser. No. 62/768,048, filed Nov. 15, 2018, and entitled "ANTI-STICTION BOTTOM CAVITY SURFACE FOR MICROMACHINED ULTRASOUND TRANSDUCER DEVICES", which is hereby incorporated herein by reference in its entirety.

This application claims the benefit under 35 U.S.C. § 119(e) of U.S. Patent Application Ser. No. 62/810,358, filed Feb. 25, 2019, and entitled "ADAPTIVE CAVITY THICKNESS CONTROL FOR MICROMACHINED ULTRASONIC TRANSDUCER DEVICES," which is hereby incorporated herein by reference in its entirety.

FIELD

The present disclosure relates generally to micromachined ultrasonic transducers and, more specifically, to an anti-stiction, bottom cavity surface for micromachined ultrasonic transducer cavities and transducer manufacturing techniques.

BACKGROUND

Ultrasound devices may be used to perform diagnostic imaging and/or treatment, using sound waves with frequencies that are higher than those audible to humans. When pulses of ultrasound are transmitted into tissue, sound waves are reflected off the tissue with different tissues reflecting varying degrees of sound. These reflected sound waves may then be recorded and displayed as an ultrasound image to the operator. The strength (amplitude) of the sound signal and the time it takes for the wave to travel through the body provide information used to produce the ultrasound images.

Some ultrasound imaging devices may be fabricated using micromachined ultrasonic transducers, including a flexible membrane suspended above a substrate. A cavity is located between part of the substrate and the membrane, such that the combination of the substrate, cavity and membrane form a variable capacitor. When actuated by an appropriate electrical signal, the membrane generates an ultrasound signal by vibration. In response to receiving an ultrasound signal, the membrane is caused to vibrate and, as a result, generates an output electrical signal.

SUMMARY

In one aspect, a method of forming an ultrasonic transducer devices includes forming an insulating layer having topographic features over a lower transducer electrode layer of a substrate; forming a conformal, anti-stiction layer over the insulating layer such that the conformal layer also has the topographic features; defining a cavity in a support layer formed over the anti-stiction layer; and bonding a membrane to the support layer.

In some embodiments, the method further comprises forming the topographic features, the topographic features corresponding to a region of contact between the conformal, anti-stiction layer and the membrane in a collapse mode of transducer operation. In some embodiments, forming the insulating layer having topographic features further comprises: forming a first type layer over the substrate and a second type sacrificial layer over the first type layer; lithographically patterning and removing portions of the second type sacrificial layer; forming a third type layer over the patterned second type sacrificial layer and first type layer; planarizing the third type layer to a top surface of the patterned second type sacrificial layer; and removing remaining portions of the patterned second type sacrificial layer. In some embodiments, the first type layer comprises $SiO_2$, the second type sacrificial layer comprises SiN; and the third type layer comprises $SiO_2$. In some embodiments, the conformal, anti-stiction layer comprises a thin film aluminum oxide layer formed by atomic layer deposition (ALD). In some embodiments, the thin film aluminum oxide layer is formed at a thickness of about 20-40 nm. In some embodiments, the first type layer is formed at a thickness of about 10-30 nm; the second type sacrificial layer is formed at a thickness of about 30-70 nm; and the third type layer is formed at a thickness of about 400-700 nm. In some embodiments, forming the insulating layer having topographic features further comprises: forming a first type layer over the substrate; lithographically patterning and removing portions of the first type layer to temporarily expose portions of the lower electrode layer and define the topographic features; and conformally depositing additional first type layer material over the first type layer in a manner that maintains the topographic features. In some embodiments, forming the conformal, anti-stiction layer further comprises conformally depositing a second type layer over the additional first type layer material. In some embodiments, the method further comprises: conformally depositing third type layer over the second type layer, the third type layer comprising a chemical mechanical polishing (CMP) stop layer; depositing a fourth type layer over the third type layer, the fourth type layer comprising a CMP buffer layer; and planarizing the fourth type layer to a top surface of the third type layer. In some embodiments, the method further comprises: depositing a membrane support layer over the CMP stop layer; lithographically patterning and etching the membrane support layer, the CMP stop layer, and any remaining portions of the CMP buffer layer to expose the anti-stiction layer. In some embodiments, the first type layer comprises $SiO_2$; the second type layer comprises a thin film aluminum oxide layer formed by atomic layer deposition (ALD); the third type layer comprises SiN; and the fourth type layer comprises $SiO_2$. In some embodiments, the thin film aluminum oxide layer is formed at a thickness of about 20-40 nm. In some embodiments, the first type layer is formed at a thickness of about 10-30 nm; the additional first type layer material is formed at a thickness of about 10-30 nm; the third type layer is formed at a thickness of about 20-50 nm; and the fourth type layer is formed at a thickness of about 400-700 nm.

In another aspect, an ultrasonic transducer device includes an insulating layer having topographic features disposed over a lower transducer electrode layer of a substrate; a conformal, anti-stiction layer disposed over the insulating layer such that the conformal layer also has the topographic features; a cavity defined in a support layer formed over the anti-stiction layer; and a membrane bonded to the support layer.

In some embodiments, the conformal, anti-stiction layer comprises a thin film aluminum oxide layer. In some embodiments, the thin film aluminum oxide layer is formed at a thickness of about 20-40 nm. In some embodiments, the topographic features correspond to a region of contact between the conformal, anti-stiction layer and the membrane in a collapse mode of transducer operation. In some embodiments, the ultrasonic transducer device further comprises a chemical mechanical polishing (CMP) stop layer disposed between the anti-stiction layer and the support layer. In some embodiments, the CMP stop layer comprises SiN. In some embodiments, the topographic features of the insulating layer comprise: a lower elevation region; and a plurality of posts defined within the lower elevation region, wherein top surfaces of the plurality of posts are disposed at a higher elevation than the lower elevation region. In some embodiments, the plurality of posts are circular, having a first diameter and the lower elevation region has a second diameter. In some embodiments, an area of the lower elevation region corresponds to an area of the membrane that comes into contact with the insulating layer during a collapse mode of operation. In some embodiments, the first diameter is about 3 microns (μm), and the plurality of posts are spaced at a pitch of about 3 μm with respect to another. In some embodiments, the second diameter is about 40 μm and a diameter of the cavity is about 200 μm. In some embodiments, the second diameter is about 140 μm and a diameter of the cavity is about 200 μm.

BRIEF DESCRIPTION OF THE DRAWINGS

Various aspects and embodiments of the application will be described with reference to the following figures. It should be appreciated that the figures are not necessarily drawn to scale. Items appearing in multiple figures are indicated by the same reference number in all the figures in which they appear.

FIG. 1 is a cross-sectional view of an exemplary micromachined ultrasonic transducer device.

FIG. 2 is a cross-sectional view of an exemplary micromachined ultrasonic transducer device having an anti-stiction bottom cavity surface according to an embodiment.

FIGS. 9-1 through 9-7 are a series of cross-sectional views illustrating an exemplary process flow for forming a micromachined ultrasonic transducer device having an anti-stiction bottom cavity surface according to an embodiment.

FIGS. 11-1 through 11-9 are a series of cross-sectional views illustrating an exemplary process flow for forming a micromachined ultrasonic transducer device having an anti-stiction bottom cavity surface according to another embodiment.

DETAILED DESCRIPTION

The techniques described herein relate to an anti-stiction, bottom cavity surface for micromachined ultrasonic transducer cavities.

One type of transducer suitable for use in ultrasound imaging devices is a micromachined ultrasonic transducer (MUT), which can be fabricated from, for example, silicon and configured to transmit and receive ultrasound energy. MUTs may include capacitive micromachined ultrasonic transducers (CMUTs) and piezoelectric micromachined ultrasonic transducers (PMUTs), both of which can offer several advantages over more conventional transducer designs such as, for example, lower manufacturing costs and fabrication times and/or increased frequency bandwidth. With respect to the CMUT device, the basic structure is a parallel plate capacitor with a rigid bottom electrode and a top electrode residing on or within a flexible membrane. Thus, a cavity is defined between the bottom and top electrodes. In some designs (such as those produced by the assignee of the present application for example), a CMUT may be directly integrated on an integrated circuit that controls the operation of the transducer. One way of manufacturing a CMUT is to bond a membrane substrate to an integrated circuit substrate, such a complementary metal oxide semiconductor (CMOS) substrate. This may be performed at temperatures sufficiently low enough to prevent damage to the devices of the integrated circuit.

Figures 1, 11:
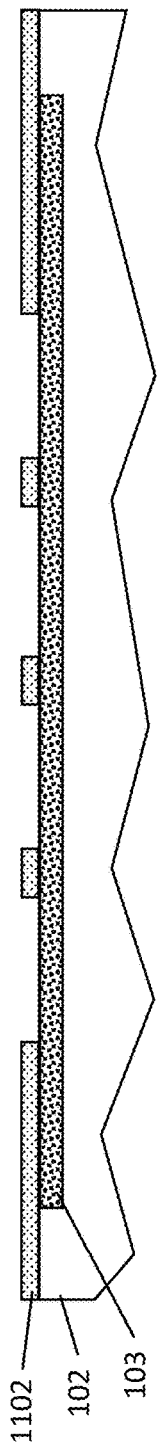

Referring initially now to FIG. 1, there is shown a cross-sectional view of an exemplary micromachined ultrasonic transducer device 100, such as a CMUT. The transducer device 100 includes a substrate, generally designated by 102, (e.g., a complementary metal oxide semiconductor (CMOS) substrate, such as silicon) having one or more layers such as for example: CMOS circuits, wiring layers, redistribution layers, insulation/passivation layers and one or more metal electrode layers 103. Such metal electrode layer(s) 103 of the substrate 102 may serve as a transducer bottom electrode. As specific substrate and transducer bottom electrode patterns are not the focus of the present disclosure, only a single example is presented in the figures. It will be appreciated, however, that the present embodiments may also be implemented in conjunction with several other transducer electrode structures including (but not limited to), for example: donut shaped electrodes (e.g., interior metal removed), multiple segment or ring electrodes, and additional metal patterns used for other purposes besides bottom electrodes (e.g., cavity getter during bonding).

Still referring to FIG. 1, it will be seen that the substrate 102 (including bottom electrode) may have one or more insulating layers formed thereon, generally designated by stack 104. A transducer cavity 105 is defined by lithographic patterning and etching of a support layer 106 that is formed on stack 104. The support layer 106 may be an insulating layer, such as $SiO_2$ for example, the remaining portions of which provide a support surface to which a flexible transducer membrane 108 (e.g., highly doped silicon at a concentration of about $1 \times 10^{18}$ atoms/cm$^3$ to about $1 \times 10^{19}$ atoms/cm$^3$) is bonded.

During operation of the transducer device 100, whether in a transmit mode and/or a receive mode, the transducer membrane 108 may come into physical contact with the top of the stack 104 (i.e., the bottom surface of the cavity 105), as indicated by the dashed position of the membrane 108' in FIG. 1. This position may be indicative of the so-called "collapse mode" of operation as known in the art. A "collapse mode" (also used interchangeably with the term "collapsed mode") refers to a mode of transducer operation in which at least one portion of a micromachined ultrasonic transducer membrane is mechanically fixed and at least one portion of the membrane is free to vibrate based on a changing voltage differential between the bottom electrode and the top membrane. On one hand, operating a micromachined ultrasonic transducer in collapse mode may optimize the acoustic power (output pressure) produced by the transducer. On the other hand, however, one side effect of a micromachined ultrasonic transducer operating in collapse mode may be charge retention (also known as "charge trapping"), wherein the membrane and/or the bottom cavity surface undesirably stores charge or conducts leakage current. As a result, this charge retention may in turn undesirably alter an applied voltage at which membrane collapse is induced during device operation. Another possible side effect of collapse mode for the transducer 100 of FIG. 1 may be stiction, which is associated with the amount of surface area of contact between the membrane 108 and the bottom surface of the cavity 105 wherein the two surfaces inadvertently stick to one another. Stiction generally will lead to device reliability failure, and hence should be addressed to make sure the device can perform properly through its operation lifetime.

Figures 2, 11:
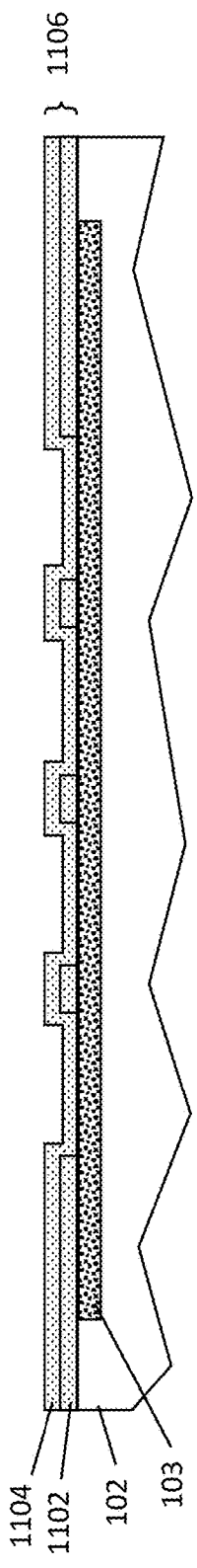
Figures 3, 11:
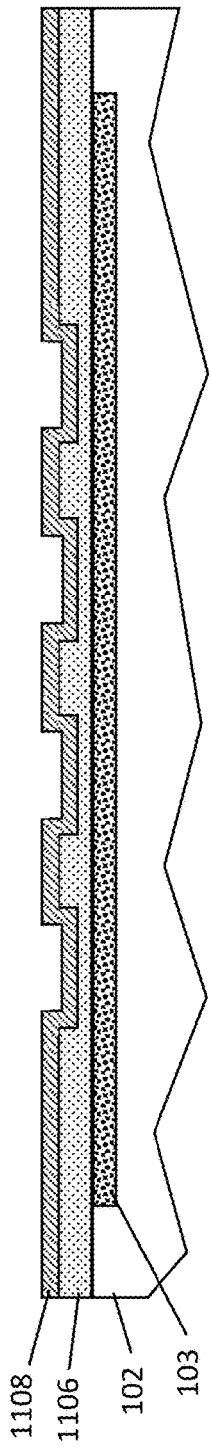
Figures 4, 11:
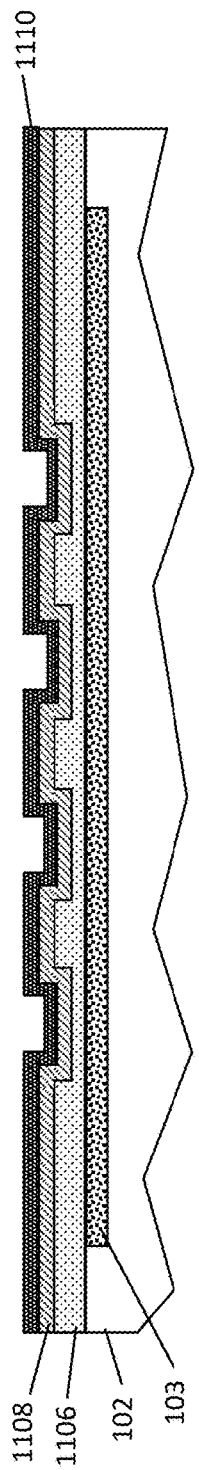
Figures 5, 11:
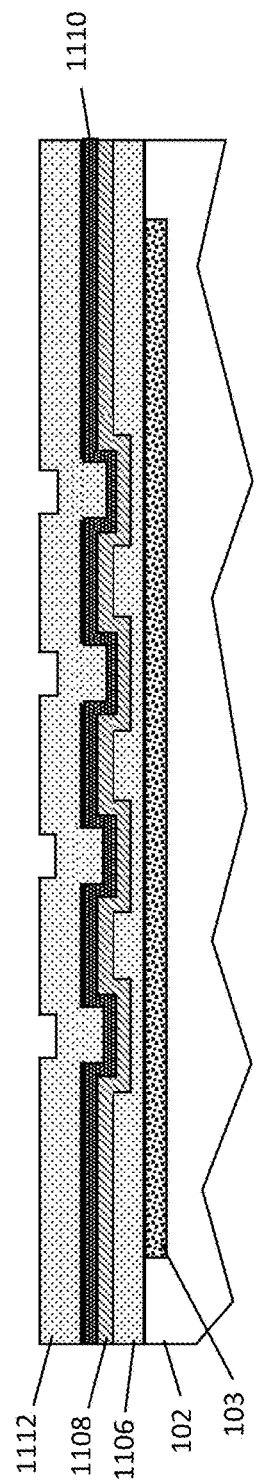
Figures 6, 11:
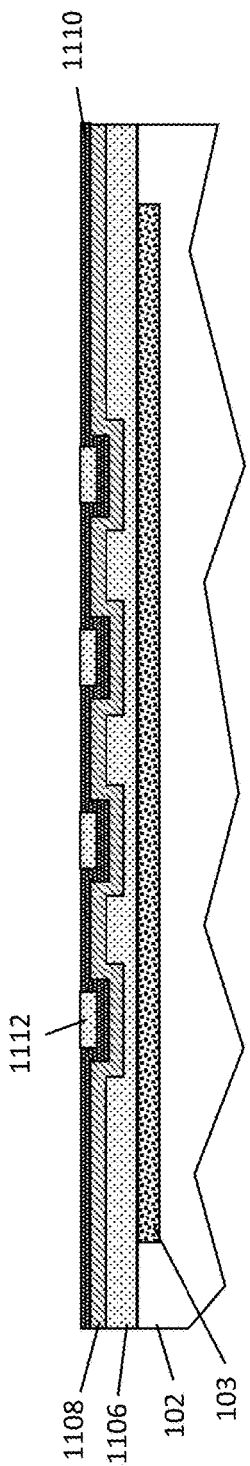
Figures 7, 11:
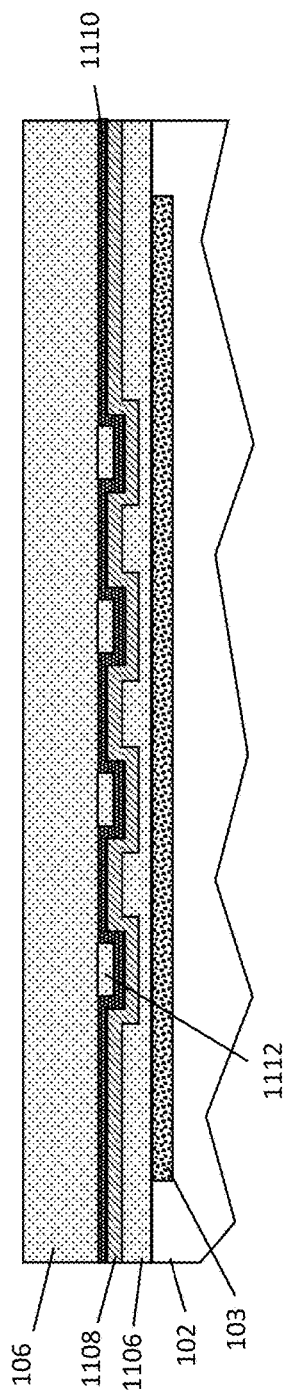
Figures 8, 11:
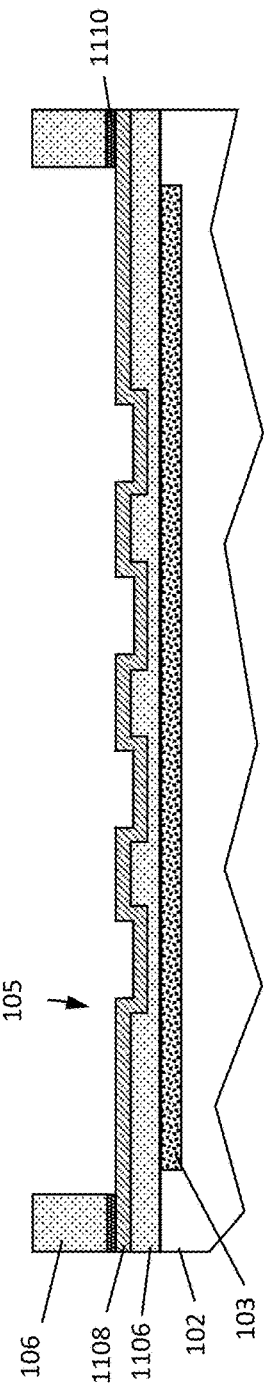

Accordingly, FIG. 2 illustrates a cross-sectional view of an exemplary micromachined ultrasonic transducer device 200 having an anti-stiction bottom cavity surface according to an embodiment. For ease of illustration, like elements among the various figures are designated with the same reference numbers. In the embodiment of FIG. 2, the substrate 102 (including bottom electrode) may have one or more insulating layers formed thereon, generally designated by stack 204. In contrast to the embodiment of FIG. 1, the uppermost layer of stack 204 is characterized by having topographic features, so as to reduce the amount of direct surface contact area between the collapsed membrane 108' and the top layer of the stack 204.

Figure 4:
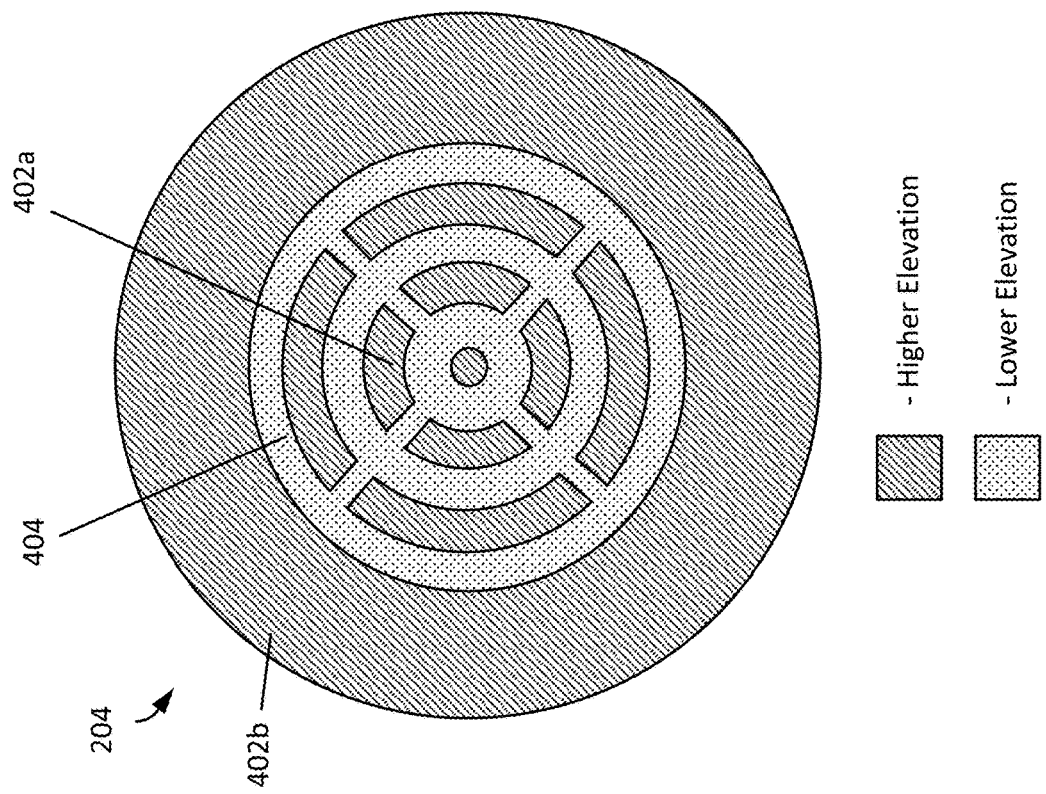
FIG. 4 is top view of an anti-stiction bottom cavity surface according to another embodiment.
Figure 3:
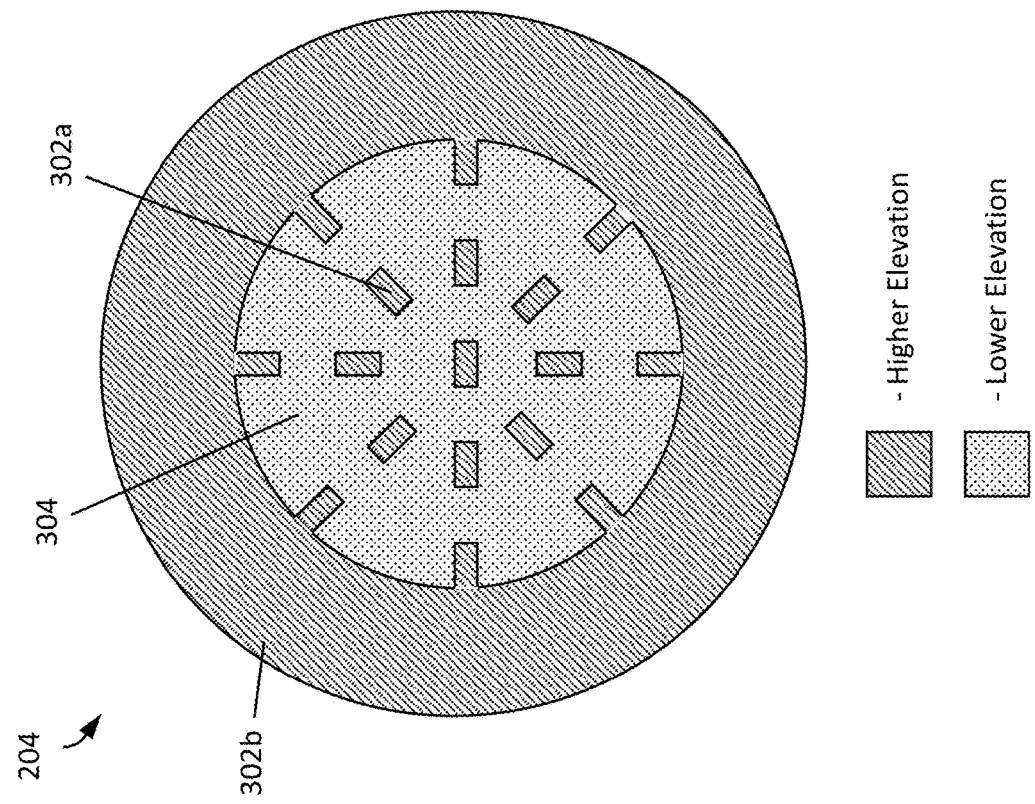
FIG. 3 is top view of an anti-stiction bottom cavity surface according to one embodiment.

Although there are several possible topographic patterns that may be used for the stack 204, some specific examples are illustrated in FIGS. 3-6, each of which depicts a top view of an anti-stiction bottom cavity surface according to various embodiments. As indicated by the legends in FIGS. 3-6, the darker and lighter shades represent different elevations of a same anti-stiction material layer (as opposed to the shades representing different materials located at a same elevation). In the embodiment of FIG. 3, the topographic (e.g., raised) regions 302a may have a generally rectangular shape, disposed in generally concentric circular patterns from a cavity center. The topographic regions 302a (as well as the additional darker shaded region 302b of the stack 204 proximate the outer perimeter of the cavity) are disposed at a higher elevation than the lighter shaded regions 304. As will be described in further detail, the topmost layer of the stack 204 may include a thin film, anti-stiction layer conformally deposited over previously defined topography located in a lower layer(s) of the stack 204. In the embodiment of FIG. 4, the topographic regions 402a may be generally circular and/or ring shaped, and optionally segmented. Again, as is with the case of the FIG. 3 embodiment, topographic regions 402a (as well as the additional darker shaded region 402b of the stack 204 proximate the outer perimeter of the cavity) are at a higher elevation than lighter shaded regions 404.

Figure 6:
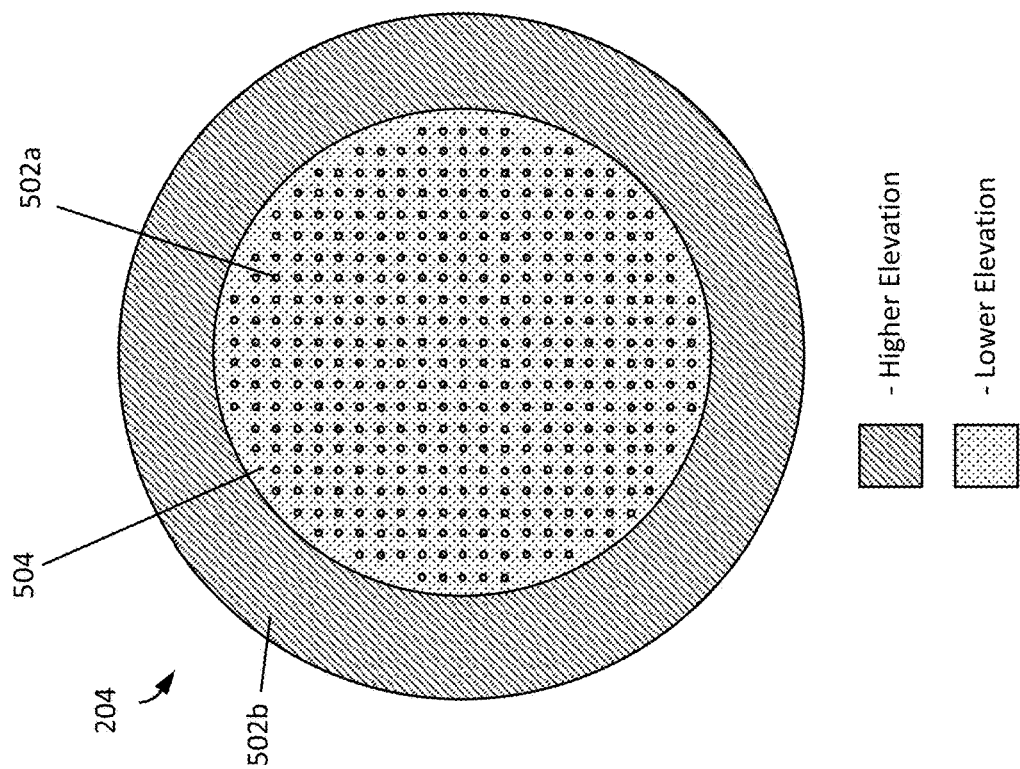
FIG. 6 is top view of an anti-stiction bottom cavity surface according to still another embodiment.
Figure 5:
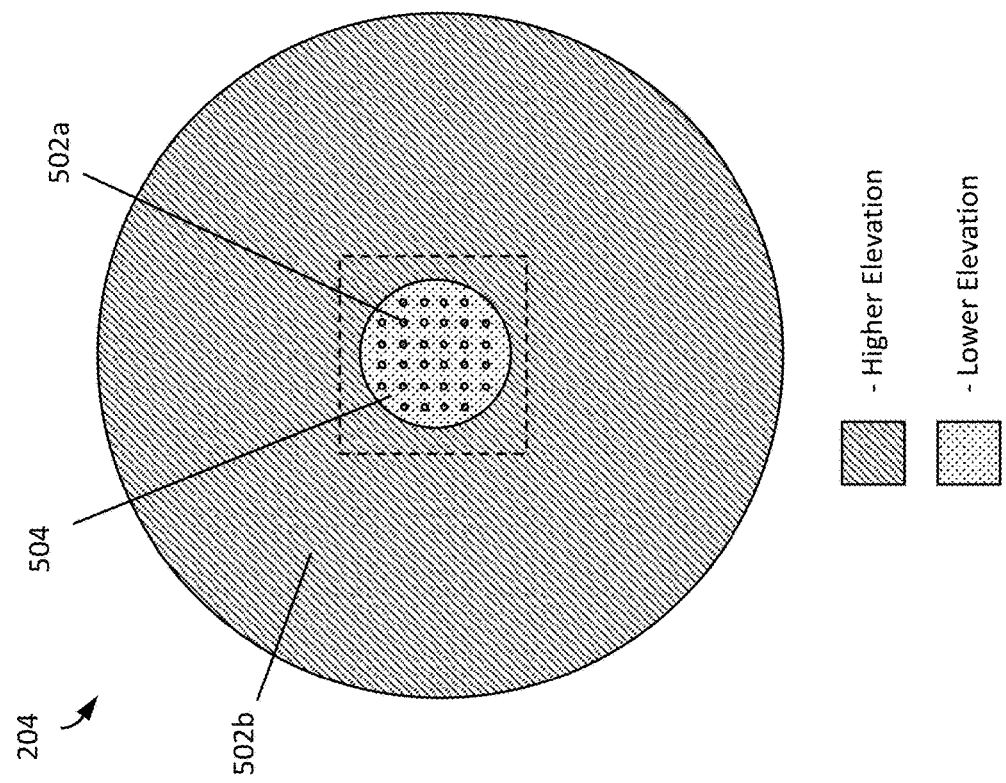
FIG. 5 is top view of an anti-stiction bottom cavity surface according to another embodiment.

Still another embodiment for the topographic patterns that may be used for the stack 204 is illustrated in FIG. 5. In this embodiment, the topographic regions 502a may be defined by an array of circular posts, generally arranged in rows and columns. As compared to an entire cavity region, the lighter shaded, lower elevation region 504 may have a relatively small area with to that of the remaining outer regions 502b of the stack 204 at the higher elevation. This embodiment may be advantageous, for example, with transducer operating modes where only a relatively small area of the transducer membrane comes into contact with the bottom cavity surface during collapse mode. On the other hand, FIG. 6 is an alternative embodiment for the stack 201, similar to FIG. 5, but with a greater number of topographic regions 502a (posts). The FIG. 6 embodiment may be advantageous, for example, with transducer operating modes where a relatively large area of the transducer membrane comes into contact with the bottom cavity surface during collapse mode.

Figure 8:
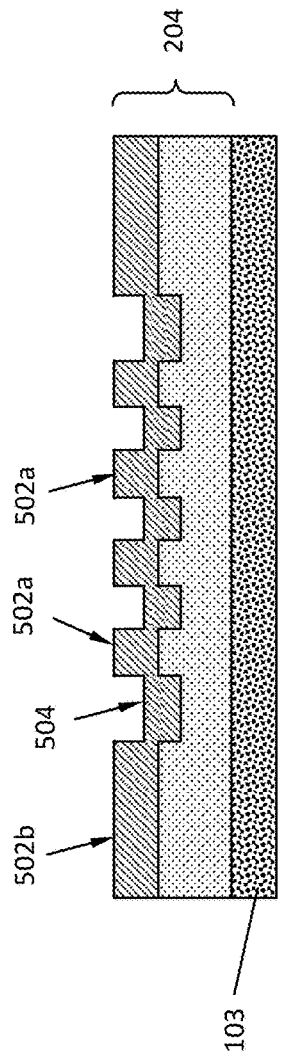
FIG. 8 is a cross-sectional view of the anti-stiction bottom cavity surface of FIG. 7, taken along the line 8-8.
Figure 7:
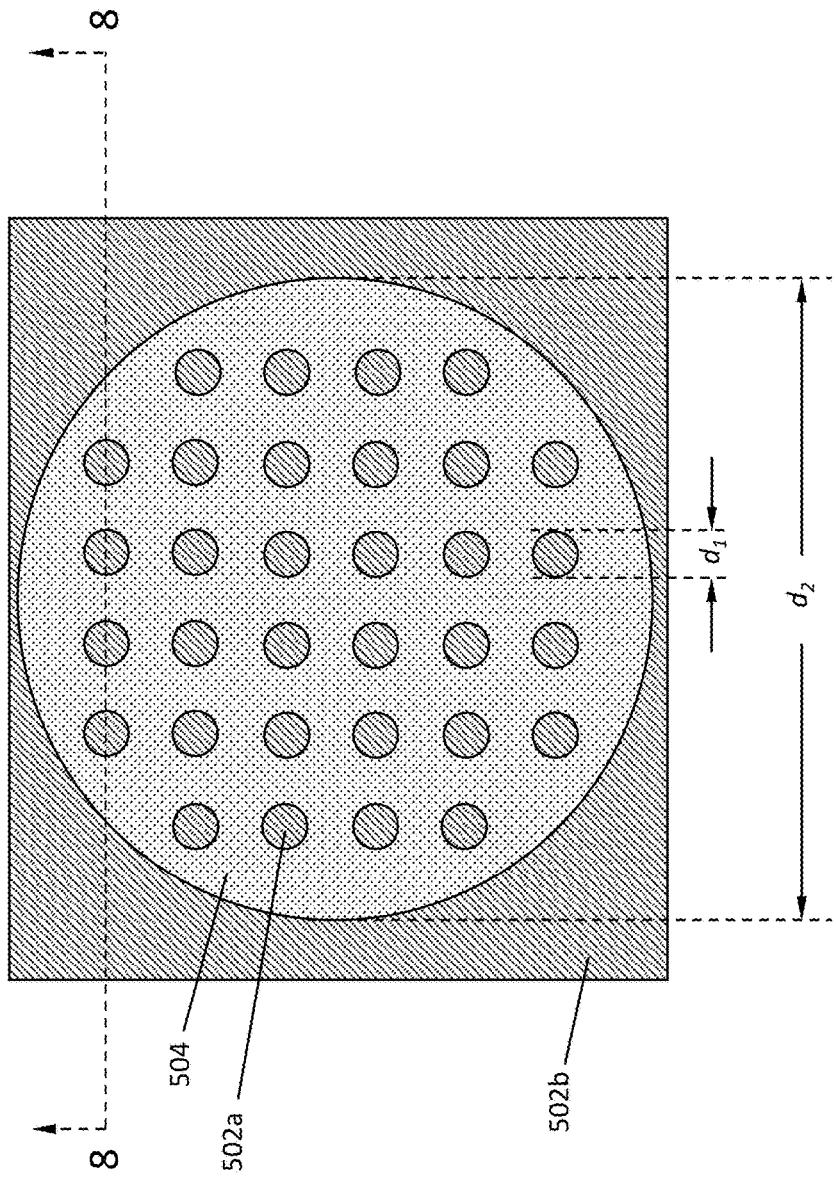
FIG. 7 is an enlarged view of a portion of FIG. 5.

An enlarged view of the dashed square region of FIG. 5 is shown in FIG. 7, and FIG. 8 is a corresponding cross-sectional view of the stack 204 taken along the line 8-8 of FIG. 7. By way of illustration only, an exemplary topographic configuration may have the topographic regions 502a (posts) dimensioned with a first diameter, $d_1$, on the order of about 3 microns (μm) and spaced at a pitch of about 3 μm. Correspondingly, a second diameter, $d_2$ of the lower elevation region 504 may be on the order of about 40 μm. Again, for the FIG. 5 embodiment, $d_2$ may be relatively small as compared to an exemplary diameter of the entire transducer cavity (e.g., about 200 μm). Alternatively, for an embodiment such as in FIG. 6, $d_2$ may be relatively larger (e.g., about 140 μm) as compared to the diameter of the entire transducer cavity (e.g., about 200 μm). It will be appreciated that these dimensions are provided for the sake of illustration only, and it is contemplated that other geometric dimensions and configurations are also possible.

Figure 10:
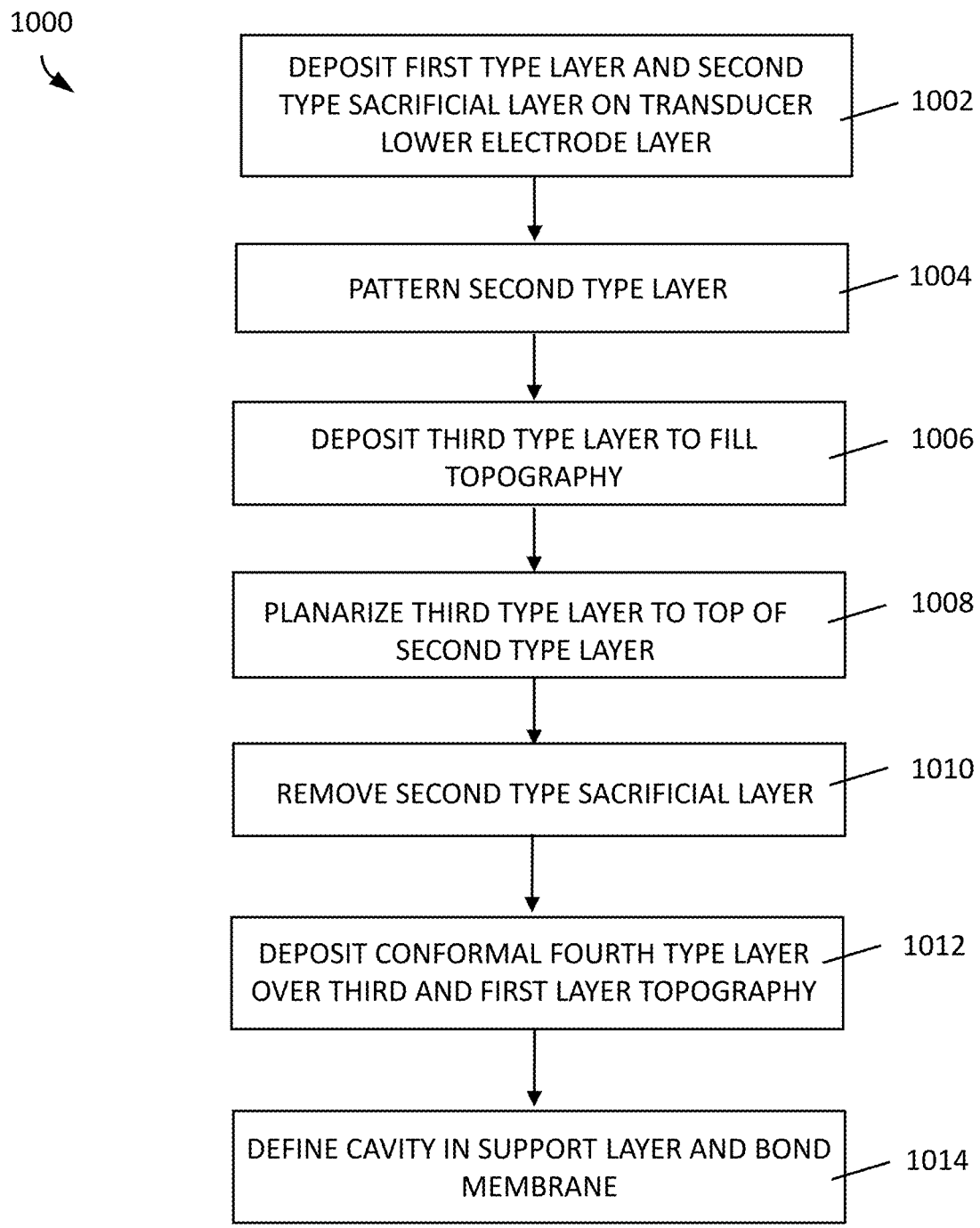
FIG. 10 is a flow diagram describing the exemplary process flow of FIGS. 9-1 through 9-7.
Figures 9, 11:
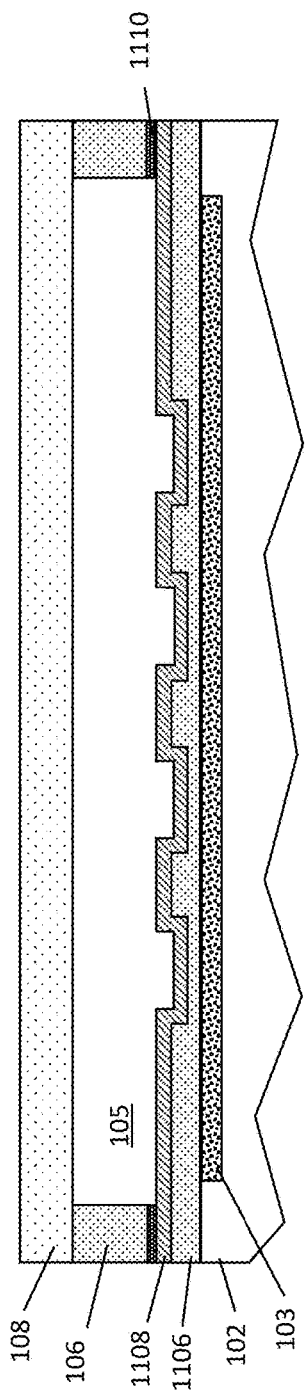

Referring generally now to FIGS. 9-1 through 9-7, there is shown a series of cross-sectional views illustrating an exemplary process for forming a micromachined ultrasonic transducer device having an anti-stiction bottom cavity surface according to an embodiment. In addition, FIG. 10 is an accompanying flow diagram describing the exemplary processing cross-sectional views of FIGS. 9-1 through 9-7. It will be appreciated that the exemplary process flow may be used to form a device such as shown in any of FIGS. 2-8, as well as other topographic structures not specifically depicted in the previously described drawings. As such, it should be understood that the topographic features depicted in the process flow of FIGS. 9-1 through 9-7 are for illustrative purposes only and should not otherwise be construed in any limiting sense.

As shown in FIG. 9-1 and indicated in block 1002 of FIG. 10, a first type layer 902 and a second type sacrificial layer 904 are deposited on a transducer lower electrode layer. More specifically, a first type layer 902 is deposited on substrate 102, and a second type sacrificial layer 904 is deposited on the first type layer 902. Again, because specific transducer bottom electrode patterns are not the focus of the present disclosure, such metal electrode layer(s) 103 should be understood to be generally incorporated into an upper portion of the substrate 102 as represented in the figures. In an exemplary embodiment, the first type layer 902 may be a thin film layer of $SiO_2$, formed at a thickness of about 10-30 nanometers (nm), and the second type sacrificial layer 904 may be a thin film layer of SiN, formed at a thickness of about 30-70 nm. As shown in FIG. 9-2 and indicated in block 1004 of FIG. 10, the second type sacrificial layer 904 is patterned (e.g., by photolithography and etching) at a region corresponding to the location of the transducer cavity.

Following patterning of the second type sacrificial layer 904, a third type layer 906 may be deposited as shown in FIG. 9-3 and indicated in block 1006 of FIG. 10. The third type layer 906 may be the same type material as the first type layer 902 (e.g., $SiO_2$) and formed at a thickness (e.g., 400-700 nm) that is sufficient to refill the regions created by patterning and removal of portions of the second type sacrificial layer 904. Then, as shown in FIG. 9-4 and indicated in block 1008 of FIG. 10, the third type layer 906 is planarized to the level of the top surface of the patterned second type sacrificial layer 904, such as by chemical mechanical polishing (CMP) for example. The second type sacrificial layer 904 may then be selectively removed (block 1010 of FIG. 10), such as by etching for example, to result in the structure shown in FIG. 9-5.

As shown in FIG. 9-6 and indicated in block 1012 of FIG. 10, the insulating stack 204 is defined by conformal deposition of a fourth type thin film layer 1008 over the topography of layers 902 and 906, such as by atomic layer deposition (ALD). Since the exemplary embodiment may use a same type material for layer 902 and 906 (e.g., $SiO_2$), the combination of layers 902/906 are depicted in subsequent figures as a single layer 910 for ease of illustration. The fourth type thin film layer 908 is selected to be an anti-stiction material, such as aluminum oxide formed at a thickness of about 20-40 nm. By conformally depositing the thin film aluminum oxide layer 908 over the topography defined by layer 910 (i.e., layers 902 and 906), a relatively uniform, continuous thin film of anti-stiction material is produced (as opposed to, for example, etching through a thin, planar layer of anti-stiction material which may result in a non-smooth, discontinuous top layer of stack 204). This in turn may be beneficial for a subsequent bonding process by, for example, providing a superior bonding interface with minimal process induced defects. Once the thin film layer 908 is formed in FIG. 9-6, additional transducer processing may continue as known in the art, such as shown in FIG. 9-7 and indicated in block 1014 of FIG. 10. This may include, for example, defining a transducer cavity in an insulating (support) layer 106 and bonding the flexible membrane 108 to patterned support portions of layer 106 as previously described. It should further be appreciated at this point that although the illustrated embodiments depict a single cavity, any suitable number of cavities and corresponding electrode structures may be formed (e.g., hundreds, thousands, tens of thousands, etc.)

Figure 12:
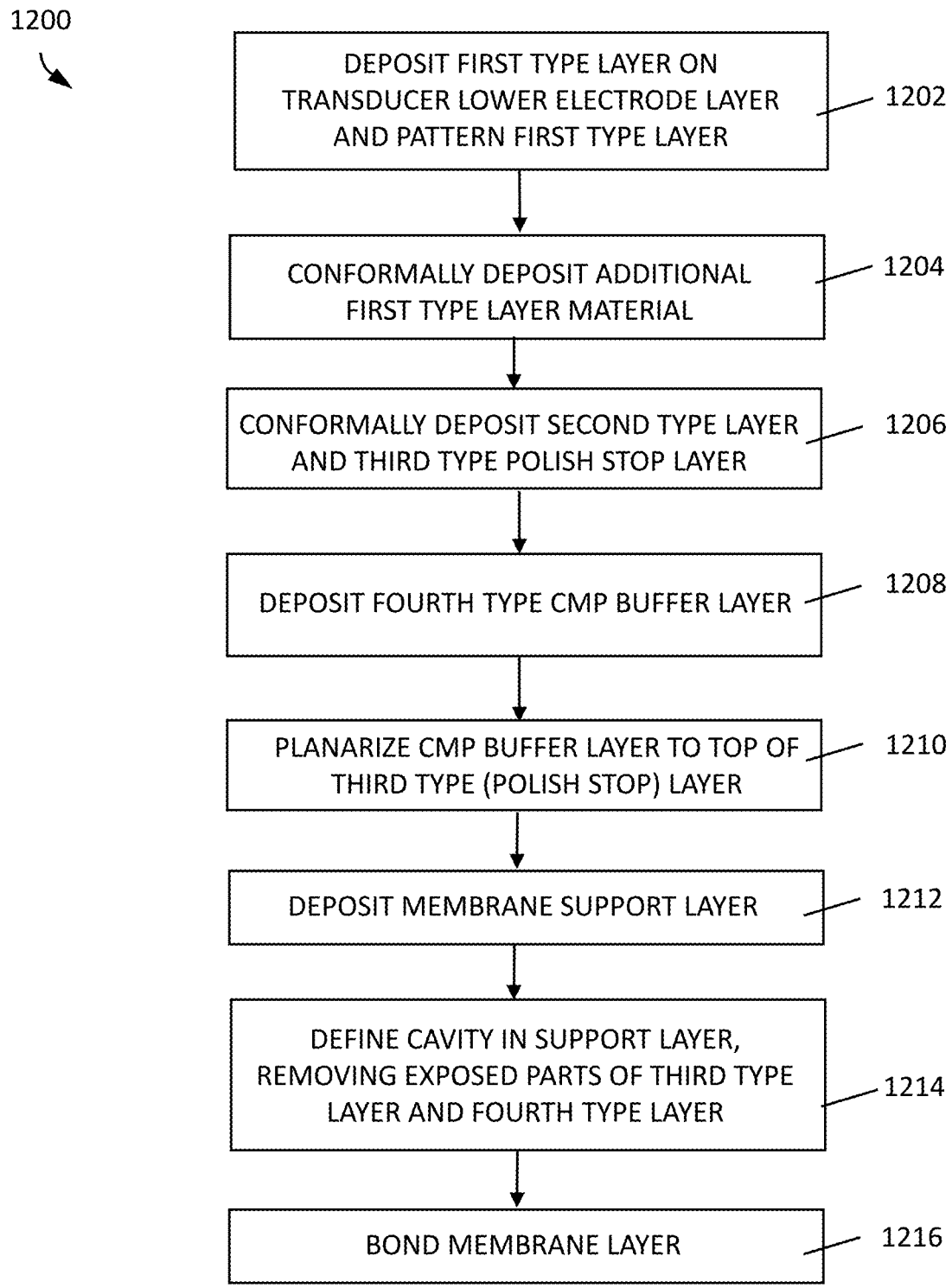
FIG. 12 is a flow diagram describing the exemplary process flow of FIGS. 11-1 through 11-9.

Referring generally now to FIGS. 11-1 through 11-9, there is shown a series of cross-sectional views illustrating an exemplary process for forming a micromachined ultrasonic transducer device having an anti-stiction bottom cavity surface according to another embodiment. In addition, FIG. 12 is an accompanying flow diagram describing the exemplary processing cross-sectional views of 11-1 through 11-9. It will be appreciated that the exemplary process flow may be used to form a device such as shown in any of FIGS. 2-8, as well as other topographic structures not specifically depicted in the previously described drawings. As such, it should again be understood that the topographic features depicted in the process flow of FIGS. 11-1 through 11-9 are for illustrative purposes only and should not otherwise be construed in any limiting sense.

As shown in FIG. 11-1 and indicated in block 1202 of FIG. 12, a first type layer 1102 is deposited on substrate 102 (e.g., a thin film layer of $SiO_2$, formed at a thickness of about 10-30 nm) and patterned (e.g., by photolithography and etching) at a region corresponding to the location of the transducer cavity. Again, because specific transducer bottom electrode patterns are not the focus of the present disclosure, such metal electrode layer(s) 103 should be understood to be generally incorporated into an upper portion of the substrate 102 as represented in the figures. As shown in FIG. 11-2 and indicated in block 1204 of FIG. 12, an additional layer 1104 of the first type material (e.g., a thin film layer of $SiO_2$, formed at a thickness of about 10-30 nm) is conformally deposited over the patterned layer 1102 and the exposed portions of the metal electrode layer(s) 103. The resulting layer 1106 (shown as a single layer in subsequent figures) has a desired bottom cavity layer topography, such as for example one corresponding to any of the patterns discussed above or other patterns not explicitly described above. It will be noted that an alternative way to form the intermediate structure shown in FIG. 11-2 could be to form a thicker layer of first type material (e.g., a thin film layer of $SiO_2$, formed at a thickness of about 20-60 nm), followed by a timed etch (i.e., one that does not go completely through the $SiO_2$ material down to the metal electrode layer(s) 103). However, the latter method as shown in the FIGS. 11-1 and 11-2 may provide a more reliable way to control topographic features such as step heights of subsequently formed layers.

Following the formation of the first type material topographical layer 1106 and as indicated in block 1206 of FIG. 12, a second type material layer 1108 is conformally deposited over layer 1106 as shown in FIG. 11-3, followed by a third type material layer 1110 conformally deposited over layer 1108 as shown in FIG. 11-4. The second type material layer 1108 may be an anti-stiction material, such as aluminum oxide formed by ALD at a thickness of about 20-40 nm. The third type material layer 1110 is selected to as to act as a CMP stop layer, and may be for example a SiN layer formed at an initial thickness of about 20-50 nm.

As shown in FIG. 11-5 and indicated in block 1208 of FIG. 12, a fourth type layer 1112 (e.g., thin film $SiO_2$) is conformally deposited over the third type material/CMP stop layer 1110 at a thickness (e.g., about 400-700 nm), and may act as a CMP buffer layer. Then, in FIG. 11-6 and as indicated in block 1210 of FIG. 12, the structure is planarized so as to substantially remove the CMP buffer layer 1112, stopping on the CMP stop layer 1110, the thickness of which may be reduced as a result of the CMP operation. Some portions of the CMP buffer layer 1112 might still remain over the lower topographic regions of the CMP stop layer 1110, as also shown in FIG. 11-6. An advantage of the above described combination of the CMP buffer layer 1112 and CMP stop layer 1110 may be to provide an anti-stiction surface 1108 integrated into a transducer device while the processing operations are still compatible with a CMUT planarization process, thereby providing a superior bonding interface with minimal process induced defects.

Following planarization, additional transducer processing operations may continue as known in the art. As shown in FIG. 11-7 and indicated in block 1212 of FIG. 12, the membrane support layer 106 (e.g., $SiO_2$) is formed. Then, as shown in FIG. 11-8 and indicated in block 1214 of FIG. 12, the membrane support layer 106 is lithographically patterned and etched to define the transducer cavity 105, where the exposed portions of the membrane support layer 106, the CMP polish stop layer 1110 and remaining CMP buffer layer 1112 are removed so as to expose the topographic anti-stiction layer 1108. The flexible membrane 108 may then be bonded to the remaining portions of the membrane support layer 106 as shown in FIG. 11-9 and indicated in block 1216 of FIG. 12. Again, it should further be appreciated at this point that although the illustrated embodiments depict a single cavity, any suitable number of cavities and corresponding electrode structures may be formed (e.g., hundreds, thousands, tens of thousands, etc.)

Figure 13:
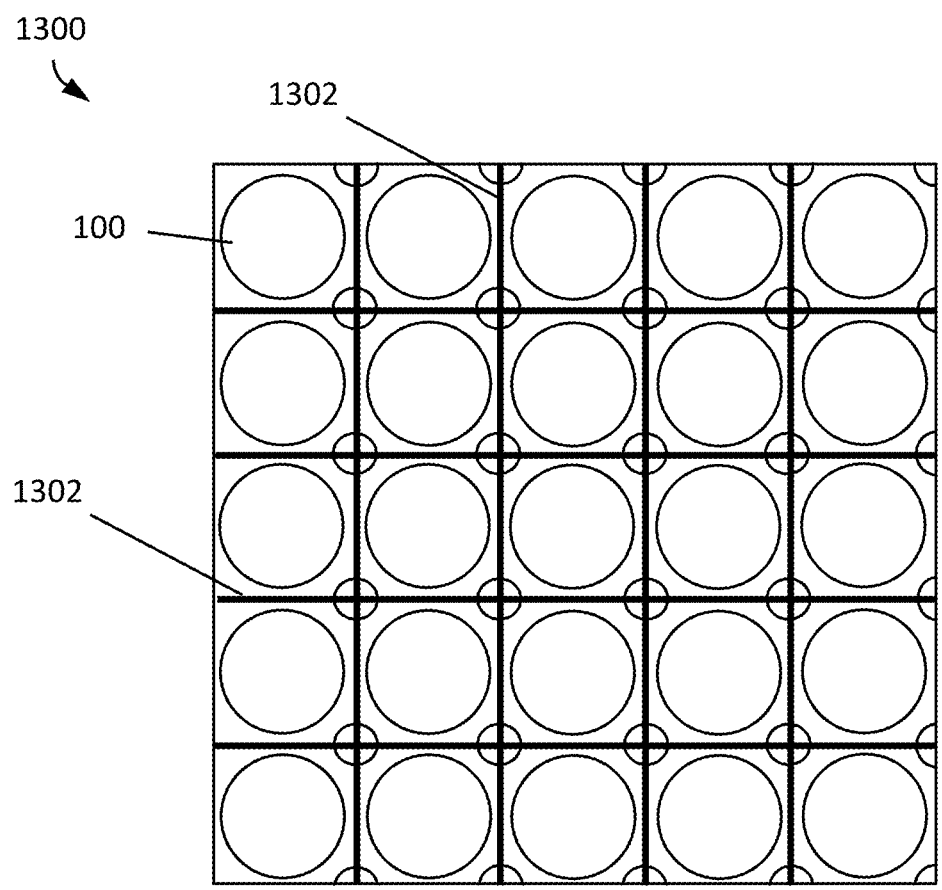
FIG. 13 is a top view of an example ultrasonic transducer device formed that may be formed using the process flow of FIGS. 9-1 through 9-7 and FIG. 10, or using the process flow of FIGS. 11-1 through 11-9 and FIG. 12.

FIG. 13 illustrates a top view of an example ultrasonic transducer device 1300 formed using any of the exemplary process flow embodiments described herein. As illustrated, the transducer device includes an array of individual transducers 100, such as those described above. The specific number of transducers 100 shown in FIG. 13 should not be construed in any limiting sense, and may include any number suitable for a desired imaging application, which may be for example on the order of tens, hundreds, thousands, tens of thousands or more. FIG. 13 further illustrates an example location of metal 1302 that may distribute an electrical signal to the membranes (upper electrodes) of the transducers 100.

It should be appreciated that although the exemplary geometric structure of this portion of the ultrasonic transducer 100 is generally circular in shape, other configurations are also contemplated such as for example, rectangular, hexagonal, octagonal, and other multi-sides shapes, etc.

The above-described embodiments can be implemented in any of numerous ways. For example, the embodiments may be implemented using hardware, software or a combination thereof. When implemented in software, the software code can be executed on any suitable processor (e.g., a microprocessor) or collection of processors, whether provided in a single computing device or distributed among multiple computing devices. It should be appreciated that any component or collection of components that perform the functions described above can be generically considered as one or more controllers that control the above-discussed functions. The one or more controllers can be implemented in numerous ways, such as with dedicated hardware, or with general purpose hardware (e.g., one or more processors) that is programmed using microcode or software to perform the functions recited above.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, some aspects of the technology may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

What is claimed is:

1. A method of forming an ultrasonic transducer device, the method comprising:
    forming an insulating layer having topographic features over a lower transducer electrode layer of a substrate;
    forming a conformal, anti-stiction layer over the insulating layer such that the conformal layer also has the topographic features;
    defining a cavity in a support layer formed over the anti-stiction layer; and
    bonding a membrane to the support layer.

2. The method of claim 1, further comprising forming the topographic features, the topographic features corresponding to a region of contact between the conformal, anti-stiction layer and the membrane in a collapse mode of transducer operation.

3. The method of claim 1, wherein forming the insulating layer having topographic features further comprises:
    forming a first type layer over the substrate and a second type sacrificial layer over the first type layer;
    lithographically patterning and removing portions of the second type sacrificial layer;
    forming a third type layer over the patterned second type sacrificial layer and first type layer;
    planarizing the third type layer to a top surface of the patterned second type sacrificial layer; and
    removing remaining portions of the patterned second type sacrificial layer.

4. The method of claim 3, wherein:
    the first type layer comprises $SiO_2$;
    the second type sacrificial layer comprises SiN; and
    the third type layer comprises $SiO_2$.

5. The method of claim 3, wherein the conformal, anti-stiction layer comprises a thin film aluminum oxide layer formed by atomic layer deposition (ALD).

6. The method of claim 5, wherein the thin film aluminum oxide layer is formed at a thickness of about 20-40 nm.

7. The method of claim 3, wherein:
    the first type layer is formed at a thickness of about 10-30 nm;
    the second type sacrificial layer is formed at a thickness of about 30-70 nm; and
    the third type layer is formed at a thickness of about 400-700 nm.

8. The method of claim 1, wherein forming the insulating layer having topographic features further comprises:
    forming a first type layer over the substrate;
    lithographically patterning and removing portions of the first type layer to temporarily expose portions of the lower electrode layer and define the topographic features; and
    conformally depositing additional first type layer material over the first type layer in a manner that maintains the topographic features.

9. The method of claim 8, wherein forming the conformal, anti-stiction layer further comprises conformally depositing a second type layer over the additional first type layer material.

10. The method of claim 9, further comprising:
    conformally depositing third type layer over the second type layer, the third type layer comprising a chemical mechanical polishing (CMP) stop layer;
    depositing a fourth type layer over the third type layer, the fourth type layer comprising a CMP buffer layer; and planarizing the fourth type layer to a top surface of the third type layer.

11. The method of claim 10, wherein defining the cavity in the support layer further comprises:
depositing a membrane support layer over the CMP stop layer;
lithographically patterning and etching the membrane support layer, the CMP stop layer, and any remaining portions of the CMP buffer layer to expose the anti-stiction layer.

12. The method of claim 11, wherein:
the first type layer comprises $SiO_2$;
the second type layer comprises a thin film aluminum oxide layer formed by atomic layer deposition (ALD);
the third type layer comprises SiN; and
the fourth type layer comprises $SiO_2$.

13. The method of claim 12, wherein the thin film aluminum oxide layer is formed at a thickness of about 20-40 nm.

14. The method of claim 13, wherein:
the first type layer is formed at a thickness of about 10-30 nm;
the additional first type layer material is formed at a thickness of about 10-30 nm;
the third type layer is formed at a thickness of about 20-50 nm; and
the fourth type layer is formed at a thickness of about 400-700 nm.

15. An ultrasonic transducer device, comprising:
an insulating layer having topographic features disposed over a lower transducer electrode layer of a substrate;
a conformal, anti-stiction layer disposed over the insulating layer such that the conformal layer also has the topographic features;
a cavity defined in a support layer formed over the anti-stiction layer; and
a membrane bonded to the support layer.

16. The ultrasonic transducer device of claim 15, wherein the conformal, anti-stiction layer comprises a thin film aluminum oxide layer.

17. The ultrasonic transducer device of claim 16, wherein the thin film aluminum oxide layer is formed at a thickness of about 20-40 nm.

18. The ultrasonic transducer device of claim 15, wherein the topographic features correspond to a region of contact between the conformal, anti-stiction layer and the membrane in a collapse mode of transducer operation.

19. The ultrasonic transducer device of claim 15, further comprising a chemical mechanical polishing (CMP) stop layer disposed between the anti-stiction layer and the support layer.

20. The ultrasonic transducer device of claim 19, wherein the CMP stop layer comprises SiN.

21. The ultrasonic transducer device of claim 15, wherein the topographic features of the insulating layer comprise:
a lower elevation region; and
a plurality of posts defined within the lower elevation region, wherein top surfaces of the plurality of posts are disposed at a higher elevation than the lower elevation region.

22. The ultrasonic transducer device of claim 21, wherein the plurality of posts are circular, having a first diameter and the lower elevation region has a second diameter.

23. The ultrasonic transducer device of claim 22, wherein an area of the lower elevation region corresponds to an area of the membrane that comes into contact with the insulating layer during a collapse mode of operation.

24. The ultrasonic transducer device of claim 22, wherein the first diameter is about 3 microns (μm), and the plurality of posts are spaced at a pitch of about 3 μm with respect to another.

25. The ultrasonic transducer device of claim 24, wherein the second diameter is about 40 μm and a diameter of the cavity is about 200 μm.

26. The ultrasonic transducer device of claim 24, wherein the second diameter is about 140 μm and a diameter of the cavity is about 200 μm.

* * * * *